United States Patent [19]
Schleicher et al.

[11] Patent Number: 6,028,809
[45] Date of Patent: Feb. 22, 2000

[54] PROGRAMMABLE LOGIC DEVICE INCORPORATING A TRISTATEABLE LOGIC ARRAY BLOCK

[75] Inventors: James Schleicher, Sunnyvale; Andy Lee, San Jose, both of Calif.

[73] Assignee: Altera Corporation, San Jose, Calif.

[21] Appl. No.: 09/100,477

[22] Filed: Jun. 19, 1998

Related U.S. Application Data

[60] Provisional application No. 60/052,469, Jul. 14, 1997, and provisional application No. 60/050,327, Jun. 20, 1997.

[51] Int. Cl.$^7$ ........................................ G11C 8/00
[52] U.S. Cl. ............................ 365/230.03; 365/230.08
[58] Field of Search ........................... 365/230.03, 230.06

[56] References Cited

U.S. PATENT DOCUMENTS

| | | | |
|---|---|---|---|
| 4,146,749 | 3/1979 | Pepping et al. | 179/15 |
| 5,550,782 | 8/1996 | Cliff et al. | 365/230.03 |

OTHER PUBLICATIONS

Bursky, Dave, "Combination RAM/PLD Opens New Application Options", Electronic Design, pp. 138–140, May 23, 1991.

Intel Corporation "10 ns Flexlogic FPGA with SRAM Option", Intel®, iFX780, pp. 2–24 2–46, Nov. 1993.

NGAI, Tony Kai–Kit, "An SRAM–Programmable Field–Reconfigurable Memory", Department of Electrical Engineering, University of Toronto, Thesis for Master of Applied Science, 1994.

Altera Corporation APEX 20K Programmable Logic Device Family, ALTERA®, Oct. 1998, ver. 1.

*Primary Examiner*—David Nelms
*Assistant Examiner*—M. Tran
*Attorney, Agent, or Firm*—Beyer & Weaver, LLP

[57] ABSTRACT

The invention relates to an integrated circuit. The integrated circuit can be a programmable logic device that incorporates a multi-function block having a plurality of integrally connected function units where at least one of the function units within the multi-function block is a tristate logic unit. The programmable logic device also includes a tristate bus operatively connected to the tristate logic unit that can supply tristate logic signals to the tristate bus as well as receive tristate logic signals from the tristate bus. The tristate bus carries tristate data signals and address select signals that operate to select a desired one of the tristate logic units within the programmable logic device.

19 Claims, 9 Drawing Sheets

PROGRAMMABLE LOGIC DEVICE INCORPORATING A TRISTATEABLE LOGIC ARRAY BLOCK

CROSS REFERENCE TO RELATED APPLICATION

This application claims benefit of priority under 35 U.S.C. 119(e) of (i) U.S. Provisional application Ser. No. 60/050,327, filed Jun. 20, 1997 and entitled "TRI-STATE LOGIC ARRAY BLOCK FOR IMPLEMENTATION OF TRI-STATE BUSSES," and (ii) U.S. Provisional application Ser. No. 60/052,469, filed Jul. 14, 1997, and entitled "TRI-STATE LOGIC ARRAY BLOCK FOR IMPLEMENTATION OF TRISTATE BUSSES."

BACKGROUND OF THE INVENTION

1. Field of the Invention

The present invention generally relates to programmable logic devices. More specifically, the present invention relates to using blocks of tristate drivers within programmable logic devices.

2. Description of the Related Art

A programmable logic device (PLD) is a programmable integrated circuit that allows the user of the circuit, using software control, to program particular logic functions the circuit will perform. Logic functions performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform particular functions required by the user's application. The PLD then can function in a larger system designed by the user just as though dedicated logic chips were employed. For the purpose of this description, it is to be understood that a programmable logic device refers to once programmable devices as well as re-programmable devices.

Programmable logic encompasses all digital logic circuits that are configured by the end user, including PLDs, field programmable gate arrays (FPGAs) and complex programmable logic devices (CPLDs). The general architecture of an embedded array programmable logic design will be generally familiar to those knowledgeable of the FLEX10Kô logic family of devices manufactured by the Altera Corporation of San Jose, Calif. Such an architecture, for example, is described in U.S. Pat. No. 5,550,782 and *Altera* Data Book 1996, both of which are incorporated herein by reference.

Figure 1:
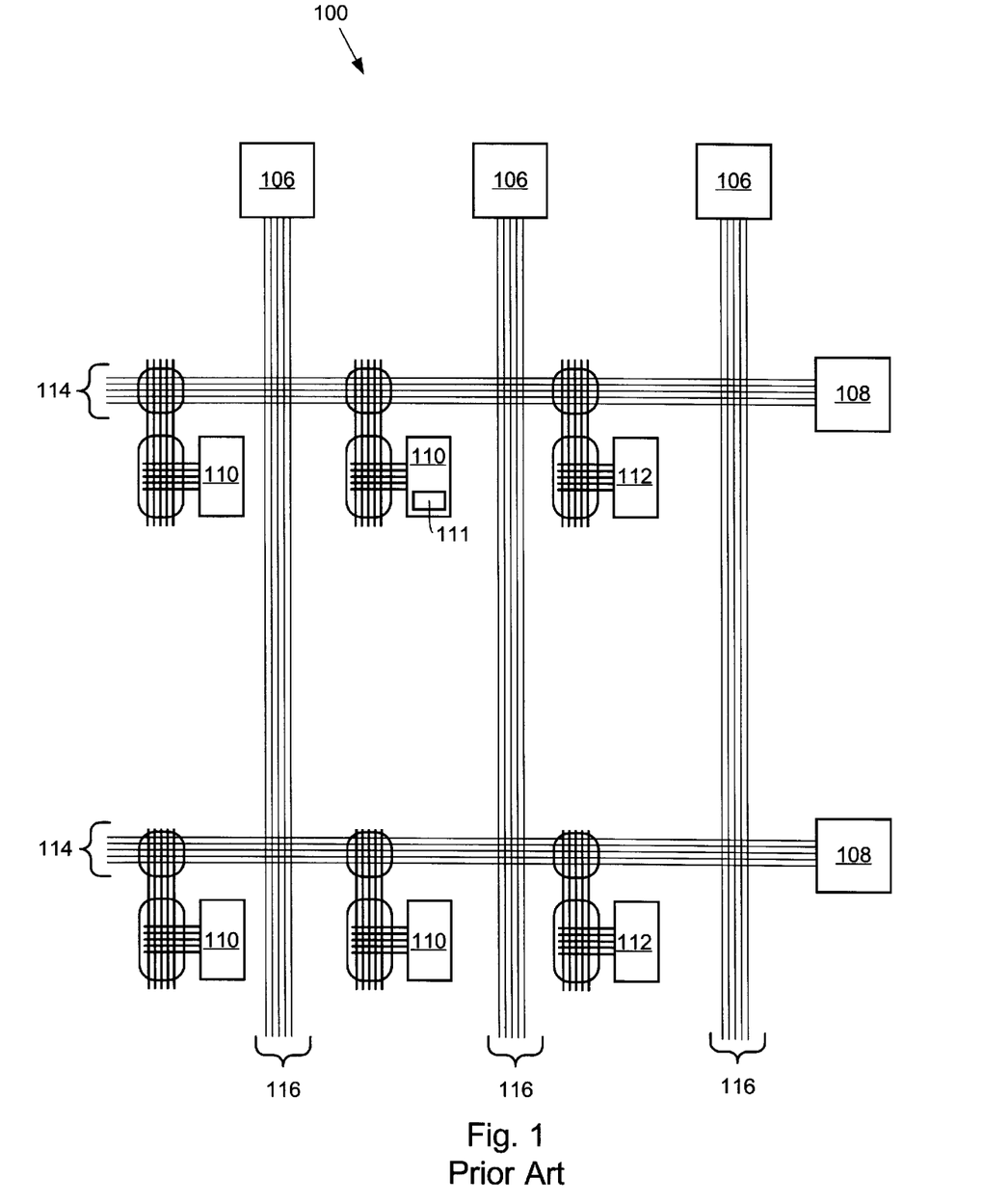
FIG. 1 is a block diagram of a conventional embedded array type complex programmable logic device architecture.

Referring initially to FIG. 1, a CPLD 100 with an embedded array programmable logic design will be described. Although only a few logic array blocks or memory blocks are illustrated, it should be appreciated that any number may be provided in order to meet the needs of a particular system.

The CPLD 100 includes a plurality of logic array blocks (LAB) 110 and a plurality of embedded array blocks (EAB) 112. Each EAB 112 includes an array of memory elements. Each LAB 110 includes a plurality of logic elements LE 111 which are capable of performing simple logic functions.

As shown in FIG. 1, the plurality of LABs 110 and the plurality of EABs 112 are programmably interconnected by way of a plurality global horizontal conductors 114 and a plurality of global vertical conductors 116 to form a logic and memory array. The global horizontal conductors 114 couple to the horizontal ports 108, and the global vertical conductors 116 couple to the vertical ports 106.

Conventional logic elements LE 111 within the LABs 110 include combinational logic arranged to produce a variety of simple functions such as, for example, a data selector. A data selector operates to select a specific data word or data bit, which then forms an output signal, which drives an output line or bus.

Figure 2:
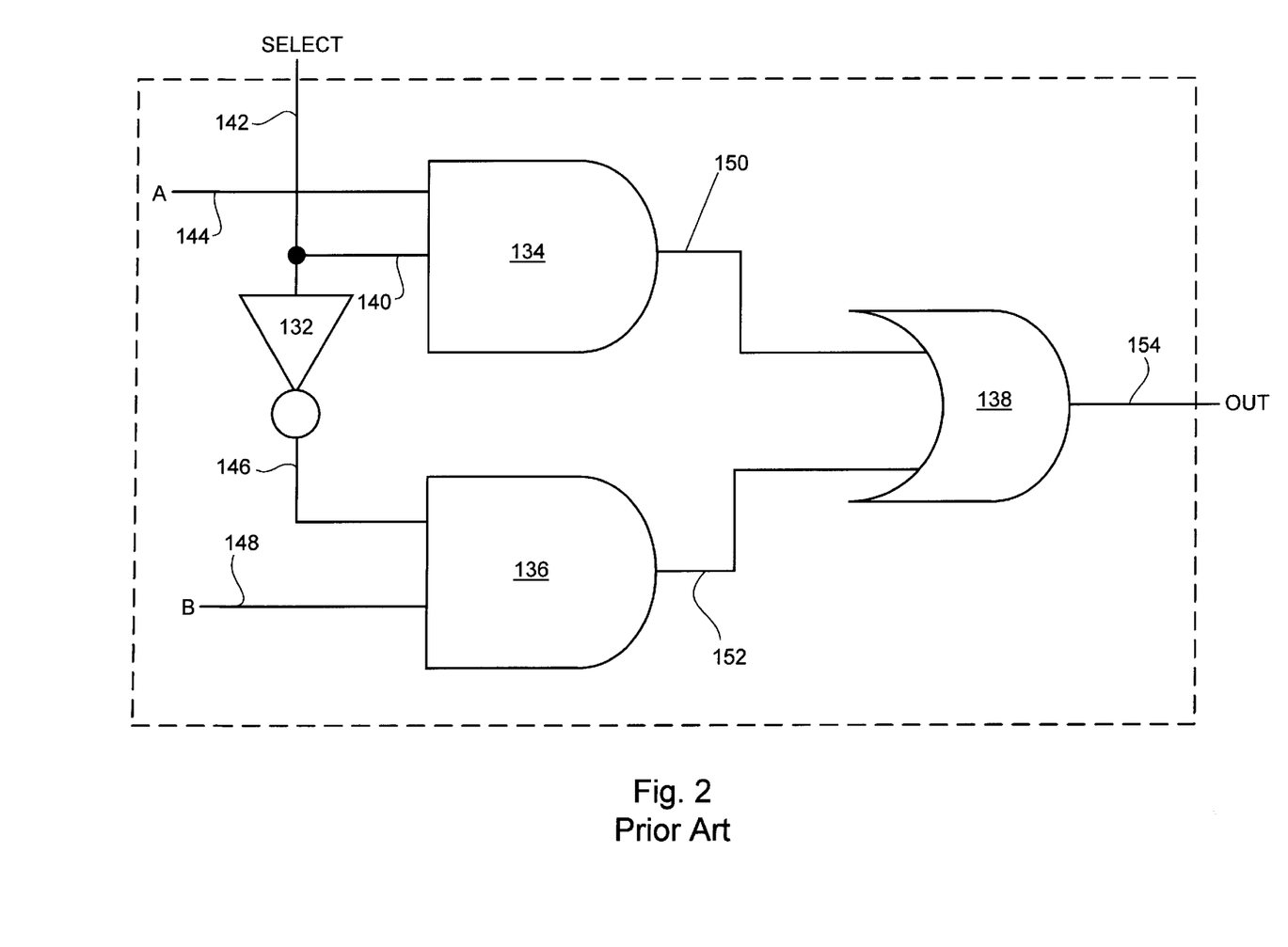
FIG. 2 is schematic diagram of a single bit data selector circuit formed by combinational logic.

FIG. 2 is a schematic diagram of a single bit data selector circuit formed by combinational logic. The single bit data selector circuit 130 includes an inverter 132, a first AND gate 134, a second AND gate 136, and an OR gate 138. The first AND gate 134 has a first input line 140 connected to an inverter input line 142 and a second input line 144 capable of receiving a first data bit A. The second AND gate has a first input line connected to an inverter output line 146 and a second input line 148 capable of receiving a second data bit B. An output line 150 from the first AND gate 134 and an output line 152 from the second AND gate 136 form a first input and a second input, respectively, to the OR gate 138. An output line 154 of the OR gate 138 carries an output signal OUT to external circuitry.

The single bit data selector circuit 130 operates as follows. A binary SELECT signal is supplied to the inverter input line 142. The binary SELECT signal causes either the first data bit A or the second data bit B to be passed to the output line 154 of the OR gate 138. By way of example, if the SELECT signal is a logical 1, the second AND gate 136 passes a logical 0 to the second input of the OR gate 138 and the first AND gate 134 passes the first data bit A to the first input of the OR gate 138. In this way, the first data bit A forms the output signal OUT. Alternatively, if the SELECT signal is a logical 0, the second data bit B forms the output signal OUT. Unfortunately, in order to accommodate data words having more than one data bit, the combinational logic structure required can become very complex such as when more sources are added such as a 4 to 1 and an 8 to 1 selector, for example.

In order to fit a desired logic function in the CPLD 100, various logic elements and/or memory blocks are individually configured to perform a small but crucial part of the overall logic and/or memory function. Any automatic place and route software such as, for example, MAX+PLUS II™ developed by the Altera Corporation of San Jose, Calif. must then logically connect all the programmed logic elements and/or memory blocks such that CPLD 100 may execute the desired logic function.

Unfortunately, when the LABs 110 (and associated logic elements LE 111) are distributed through-out the CPLD 100, fitting a desired logic function may result in substantial routing delays due to circuitous logical connections of the programmed logic elements and/or memory blocks. In certain cases, the logical connections of the programmed logic elements and/or memory blocks may be so circuitous as to create a slow data path, which may prove to be unacceptable for the application at hand. Additionally, the logical connections required to fit the logic function and/or memory-logic function typically require a substantial portion of limited routing resources available in the CPLD 100. In some instances, fitting the desired logic function requires more routing resources than are available in the CPLD 100, in which case, the fitting is said to have failed.

A tristate buffer is a device capable of operating so as to selectively produce binary logic states but also a third high impedance state known in the art as tristate mode. Tristate drivers coupled to a data bus (commonly referred to as a tristate bus) are capable of generating the same logic functions as can be generated by combinational logic.

Figure 3:
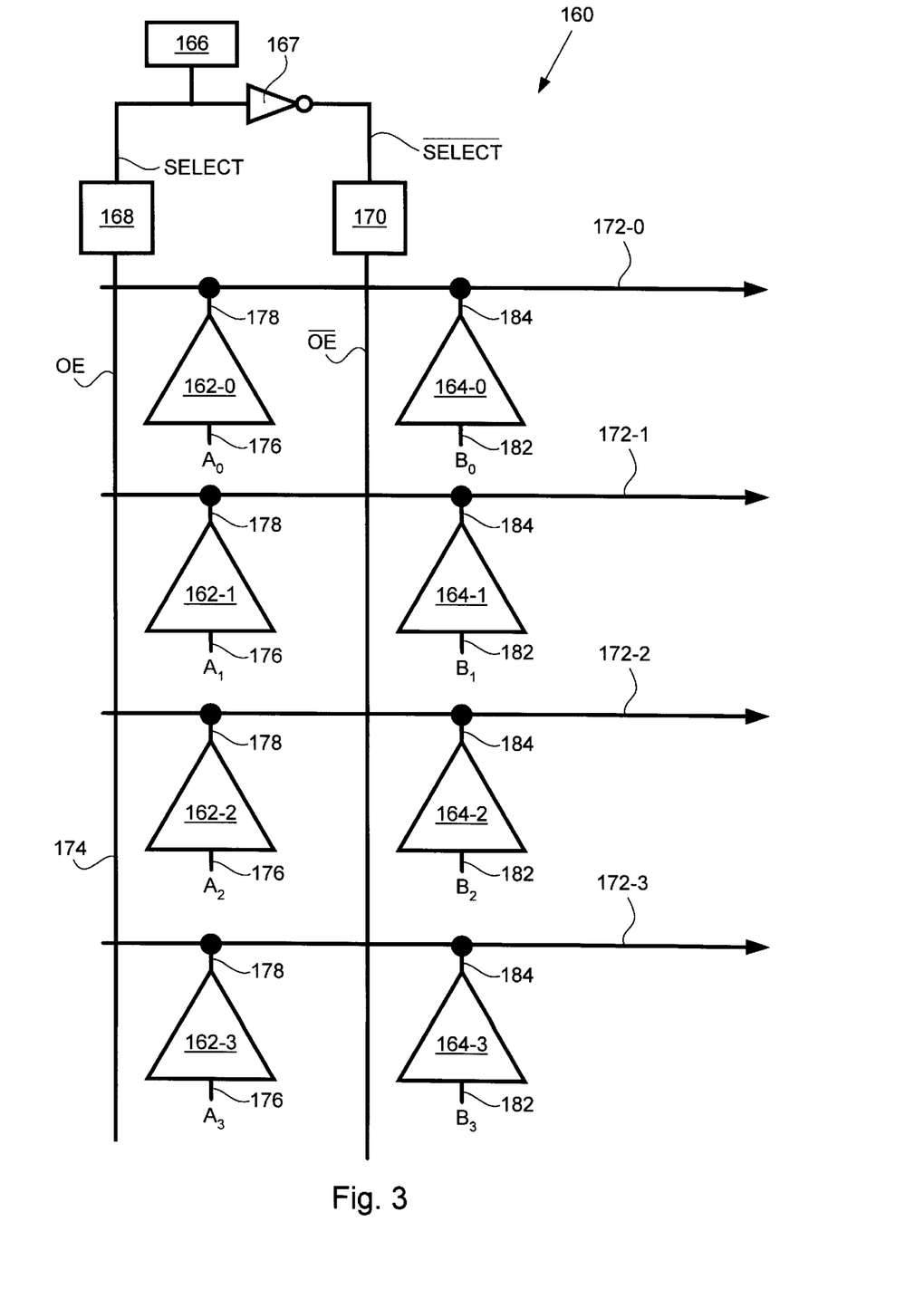
FIG. 3 is schematic diagram of a four bit data selector circuit 160 formed by tristate drivers.

FIG. 3 is schematic diagram of a four bit data selector circuit 160 formed by tristate drivers capable of selecting two data words. The four-bit data selector circuit 160 includes first tristate drivers 162-0 through 162-3 connected so as to be capable of supplying a selected first data word A (including data bits $A_0$–$A_3$) to tristate data busses 172-0 through 172-3, respectively. In a similar manner, the four-bit data selector circuit 160 also includes second tristate drivers 164-0 through 164-3 connected so as to be capable of supplying a selected second data word B to the tristate data busses 172-0 through 172-3, respectively. The four bit data selector circuit 160 also includes a SELECT signal circuit 166, a first output enable (OE) circuit 168, a second output enable circuit 170. Each of the tristate drivers 162 has an output enable (OE) line 174, and input line 176, and an output line 178. Similarly, each of the tristate drivers 164 has an output enable (OE) line 180, and input line 182, and an output line 184.

The four-bit data selector circuit 160 operates as follows. The tristate drivers 162 associated with the first data word A are enabled when a select signal SELECT generated by select signal circuit 166 is sent to the first output enable (OE) circuit 168. In response, the first output enable (OE) circuit 168 generates an output enable (OE) signal. In conventional tristate logic circuits, contention between the tristate drivers 162-0 through 162-3 and tristate drivers 164-0 through 164-3 is avoided by first inverting the select signal SELECT to form a complementary select signal /SELECT. The complementary select signal /SELECT is then sent to the second output enable (OE) circuit 168. In response, the second output enable (OE) circuit 168 sends a complementary enable (i.e., disable signal) to each of the tristate drivers 164-0 through 164-3 by way of the output enable (OE) line 180 causing the tristate drivers 164-0 through 164-3 to go into a high impedance state (i.e., tristate mode). In this manner, each of the tristate drivers 162-0 through 162-3 pass a single data bit $A_0$ through $A_3$, respectively, to the associated output buffer 172-0 through 172-3 forming thereby the data word A ($A_0$, $A_1$, $A_2$, $A_3$). For the proper operation of the four-bit data selector circuit 160, it is therefore essential that each of the tristate drivers 164-0 through 164-3 associated with the unselected data word (data word B) be in the tristate mode.

Unfortunately, the four bit data selector circuit 160 could suffer from tristate driver contention caused by line skew related to different lengths of the signal paths between, for example, the first OE signal circuit 168 and the first tristate drivers 162 and the second OE circuit 170 and the second tristate drivers 164. If, for example, the signal paths between the first OE signal circuit 168 and the first tristate drivers 162 is different then the signal paths between the second OE circuit 170 and the second tristate drivers 164, the resulting line skew may cause both the tristate drivers 162 and 164 to drive tristate bus 172 when the SELECT signal transitions. If the difference in the timing of the two paths is large, the time duration that both drivers 162 and 164 are enabled may become appreciable and driver contention may result. It is for this reason, that the circuit must be designed with minimal line skew.

Consequently, when implemented in a PLD, the four bit data selector circuit 160 lacks layout flexibility because associated tristate drivers must be spatially arranged together. Hence, by sacrificing (place and route) flexibility, a logic function using tristate buffers coupled to a tristate data bus can be fit to a PLD such that the logic design does not suffer from slow data paths by locating the tristate drivers in the same proximate location as the tristate bus. However, the resulting loss in flexibility hinders the ability to (place and route) (efficiently and otherwise) other components of the circuit design.

In view of the foregoing, it is advantageous and therefore desirable to have available a programmable logic device that incorporates tristate buffers so that routing flexibility in PLDs can be maintained even when circuit designs include tristate logic.

SUMMARY OF THE INVENTION

Broadly speaking, the invention relates to an integrated circuit that incorporates a uniquely selectable tristate driver cell block. Typically, the integrated circuit chip has a programmable logic device (PLD), or a complex programmable logic device architecture (CPLD). By using the tristate driver cell block, the invention is able to reduce the length of the path of the logical connections used to implement desired logic functions while at the same time not substantially sacrificing the probability of fitting logic functions in the CPLD. The invention is also able to prevent tristate driver bus contention by incorporating a tristate driver cell block address scheme whereby only that tristate driver cell block uniquely associated with a selected tristate driver block address is enabled.

In one embodiment of the invention, an integrated circuit, which includes a uniquely selectable tristate driver cell block, is disclosed. The integrated circuit includes a plurality of interconnect lines, a multi-function block having a plurality of integrally connected function units of which at least one is a tristate logic unit. The integrated circuit also includes a tristate bus operatively connected to the tristate logic unit of said multi-function block. The tristate logic unit can supply tristate logic signals to said tristate bus as well as receive tristate logic signals from said tristate bus.

In another embodiment of the invention, a programmable logic device is disclosed. The programmable logic device includes a plurality of interconnection lines, a plurality of programmable logic cells each of which performs desired logic functions, a programmable memory block each of which includes a plurality of memory cells capable of performing desired memory functions, an input/output (I/O) device capable of communicating to external devices, a tristate data bus, and a tristate driver block connected to the tristate data bus. The tristate driver block includes a tristate driver cell having a tristate driver cell input line, a tristate driver cell output line, and a tristate driver cell output enable line. The tristate driver block also includes a tristate driver cell address decoder unit connected to the tristate driver cell output enable line. The tristate driver cell address decoder unit receives a tristate driver cell address signal associated with a selected tristate driver cell and uses the tristate driver cell address signal to enable the selected tristate driver cell. The selected tristate driver cell in turn passes a desired data signal to the tristate data bus. The programmable logic device further includes a programmable interconnect array device configured to programmably interconnect the interconnect lines, the plurality of programmable logic cells, the tristate driver block, and the programmable memory block.

In yet another embodiment of the invention, a method of configuring a programmable logic device to implement desired logic functions is disclosed. The programmable logic device includes a core region having a plurality of interconnection lines and a multi-function block having a plurality of integrally connected function units at least one of which is a tristate logic unit operatively connected to a tristate bus. The programmable logic device also includes a peripheral region having a plurality of bi-directional I/O ports. The tristate logic unit can supply tristate logic signals to the tristate bus as well as receive tristate logic signals from the tristate bus. The method accomplished as follows. First, at least one of the plurality of bi-directional I/O ports is connected to an external circuit, the external circuit being capable of generating program signals capable of causing selected ones of the plurality of functional units included in the multi-function blocks to be programmed to perform at least a subpart of the desired logic function to be fitted. Next, the selected ones of the plurality of functional units included in the multi-function blocks are programmed using the program signals so as to perform the associated subpart of the logic function to be fitted. Next, a first desired coupling path is determined in the core region such that each of the selected ones of the plurality of functional units included in the multi-function block that have been programmed are coupled to the tristate logic unit in such away as to enable the programmable logic device to perform at least the subpart of the desired logic function. Finally, a second desired coupling path is determined from the tristate logic unit in the core region to the bi-directional I/O ports located in the peripheral region. The second desired coupling path interconnects with the first desired coupling path using the tristate data bus so as to route data signals between the bi-directional ports and the core region.

In still another embodiment of the invention, a method of using the inventive programmable logic device to perform desired logic and memory function is disclosed. The inventive programmable logic device has tristate logic units, each of which includes a plurality of drivers, data lines, and an address comparison circuit. The programmable logic device also includes a tristate bus operatively connected to said tristate logic units. The tristate bus carries tristate data signals and address select signals that operate to select a desired one of the tristate logic units within the programmable logic device. The method includes the following operations. First, a designated address signal for a desired one of said tristate logic units is received. Next, at least a first portion of the designated address signal is compared with at least one predetermined address signal associated with the tristate logic unit. Next, one or more of the drivers are selectively enabled in accordance with a second portion of the designated address signal to couple data lines within the tristate logic unit to the tristate data bus when the comparing indicates the first portion of the designated address signal matches the predetermined address signal.

Other embodiments and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE INVENTION

The invention relates to an integrated circuit that incorporates a tristate driver cell block. Typically, the integrated circuit chip has a programmable logic device (PLD) or a complex programmable logic device (CPLD) architecture. By using the tristate driver cell block, the invention is able to reduce the length of the path of the logical connections used to implement desired logic functions while at the same time not substantially sacrificing the probability of fitting logic functions in the CPLD. The invention is also able to prevent tristate driver bus contention by incorporating a tristate driver cell address scheme whereby line skew between output enable signals to different tristate drivers of the same tristate bus is limited such that the tristate driver cell uniquely associated with the selected tristate driver cell address is enabled. In the following description, numerous specific details are set forth in order to provide a thorough understanding of the present invention. It will be apparent, however, to one skilled in the art that the present invention may be practiced without some or all of these specific details. In other instances, well known structures or operations have not been described in detail in order to not unnecessarily obscure the present invention.

Figure 4A:
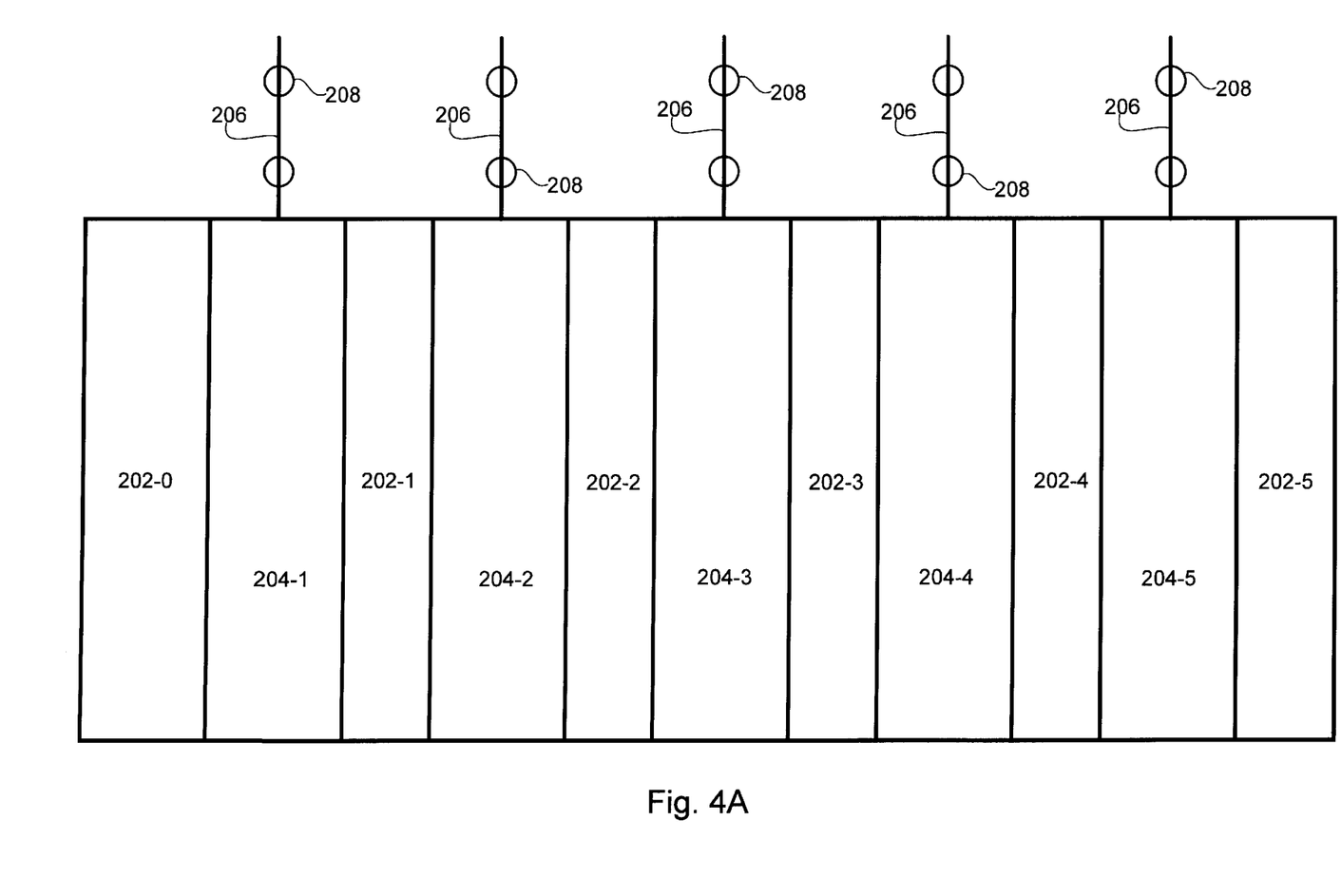
FIG. 4A is a block diagram of a multi-function block 201 in accordance with a basic embodiment of the invention.

FIG. 4A is a block diagram of a multi-function block 201 in accordance with a basic embodiment of the invention. The multi-function block 201 includes a group of function units 202 (202-0 through 202-5) interconnected by way of programmable interconnect arrays 204 (204-1 through 204-5). Each of the programmable interconnect arrays 204 receives a group of programmable interconnect array I/O lines 206. Each of the programmable interconnect array I/O lines 206 has an associated group of programmable connectors 208 that are programmed by programming resources and operate to selectively connect the interconnect array I/O lines 206 (and thus the function units 202) to other conductor lines and/or multi-function blocks, for example, included in a CPLD. It should be noted that only a few of the programmable connectors 208 are shown for sake of clarity since there can be any suitable number of the programmable connectors 208 included in a CPLD.

Although not required, the multi-function block 201 is often included in an integrated circuit such as a CPLD, and each of the function units 202 included in the multi-function block 201 can be configured in many operational modes as deemed suited for a desired application. By way of example, the function unit 202-1 can be a logic array block (LAB), the function unit 202-4 can be an embedded array block (EAB), and the function unit 202-5 can be a tristate logic array block (TLAB). In one embodiment, the tristate logic array block (TLAB) includes a tristate driver cell to perform simple logic functions using tristate logic.

The multi-function block 201 is normally formed in an integrated circuit. In a detailed embodiment of the invention discussed below, a plurality of the multi-function blocks 201 are formed in a CPLD.

Figure 4B:
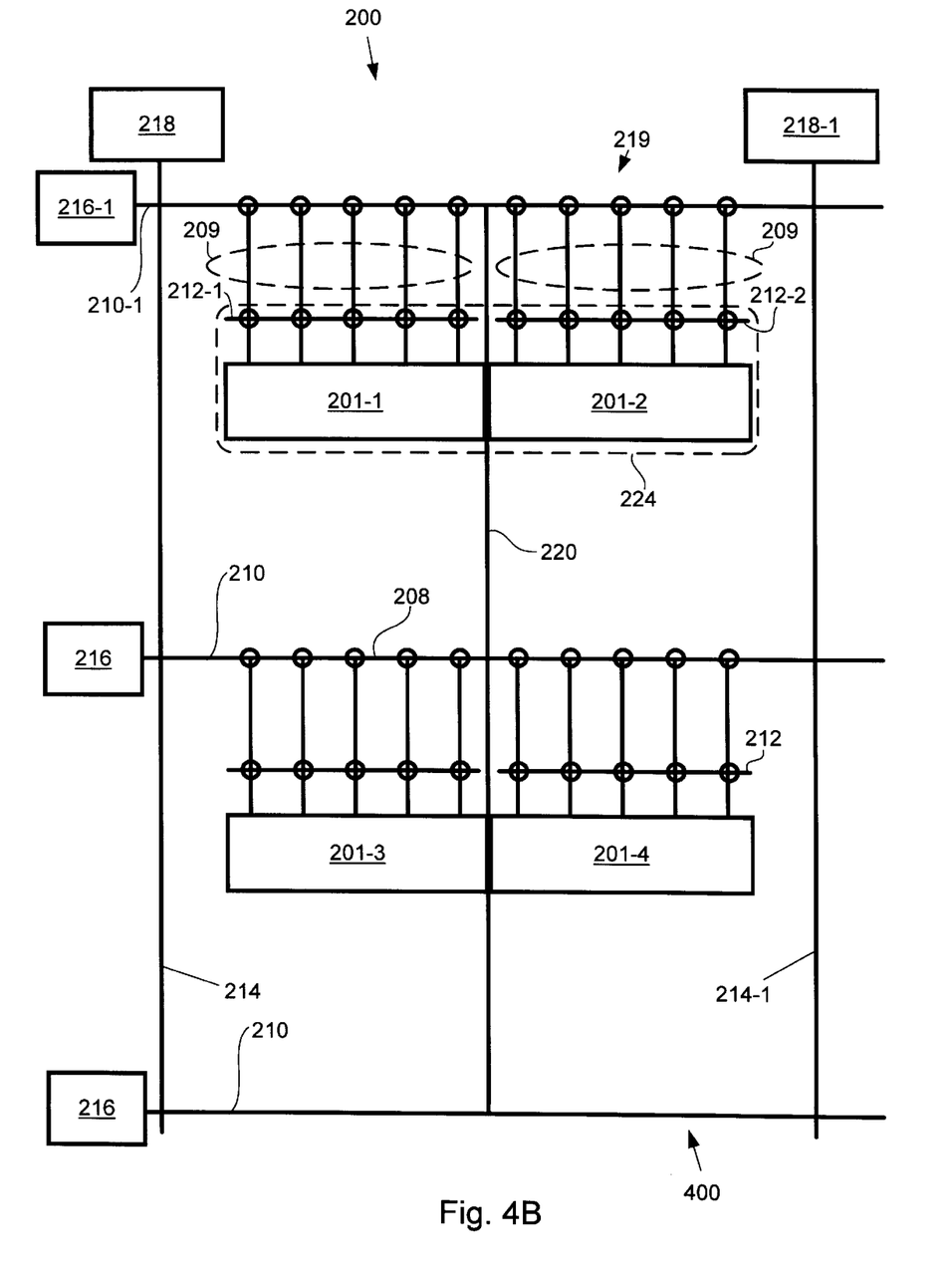
FIG. 4B is a block diagram of the CPLD that includes the plurality of the multi-function blocks shown in FIG. 4A.

FIG. 4B is a block diagram of a CPLD 200 that includes a plurality of the multi-function blocks 201. Although only a few of the multi-function blocks 201 are illustrated in FIG. 4B, it should be appreciated that any number may be provided in order to meet the needs of a particular system.

As shown in FIG. 4B, the CPLD 200 includes a plurality of multi-function blocks 201(201-1 through 201-4) included in a core region 400. Each of the multi-function blocks 201 are, respectively, programmably connected to a global horizontal conductor 210, a local horizontal conductor 212 and a global vertical conductor 214 to implement logical circuits within the CPLD 200. In one embodiment, the multi-function block 201-1 is connected to a global horizontal conductor 210-1 and a local horizontal conductor 212-1 by way of the programmable interconnect array I/O lines 206. In a similar fashion, a multi-function block 201-2 is connected to the global horizontal conductor 210-1 and a local horizontal conductor 212-2 by way of the programmable interconnect array I/O lines 206. In this way, the multi-function blocks 201-1 and 201-2 can communicate with any other of the multi-function blocks 201 included in the CPLD 200. The multi-function blocks 201-1 and 201-2 can also communicate with any external circuitry by way of the horizontal bi-directional ports 216 or the vertical bi-directional ports 218 included in a peripheral region 219. For example, either of the multi-function blocks 201-1 or 201-2 can connect to the horizontal bi-directional port 216-1 via the global horizontal conductor 210-1.

In one embodiment, the CPLD 200 includes a tristate bus 220 that can be programmably connected to the multi-function blocks 201 within the CPLD 200. For example, the tristate bus 220 can be programmably connected to the multi-function block 201-1 as well as to multi-function block 201-2 by way of a tristate bus programmable interconnect array 205. In this embodiment, the tristate bus 220 can also be connected to the local horizontal conductor 212. The tristate bus 220 can also be connected, for example, to the horizontal bi-directional port 216-1 by way of the global horizontal conductor 210. In a similar fashion, the tristate bus 220 can be connected to the vertical bi-directional port 218-1 since the global horizontal conductor 210-1 can be connected to the global vertical conductor 214-1. In this manner, the tristate bus 220 can be connected to any external circuitry suitably connected to any bi-directional port included in the CPLD 200 as well as to any multi-function blocks included in the CPLD 200.

Figure 5:
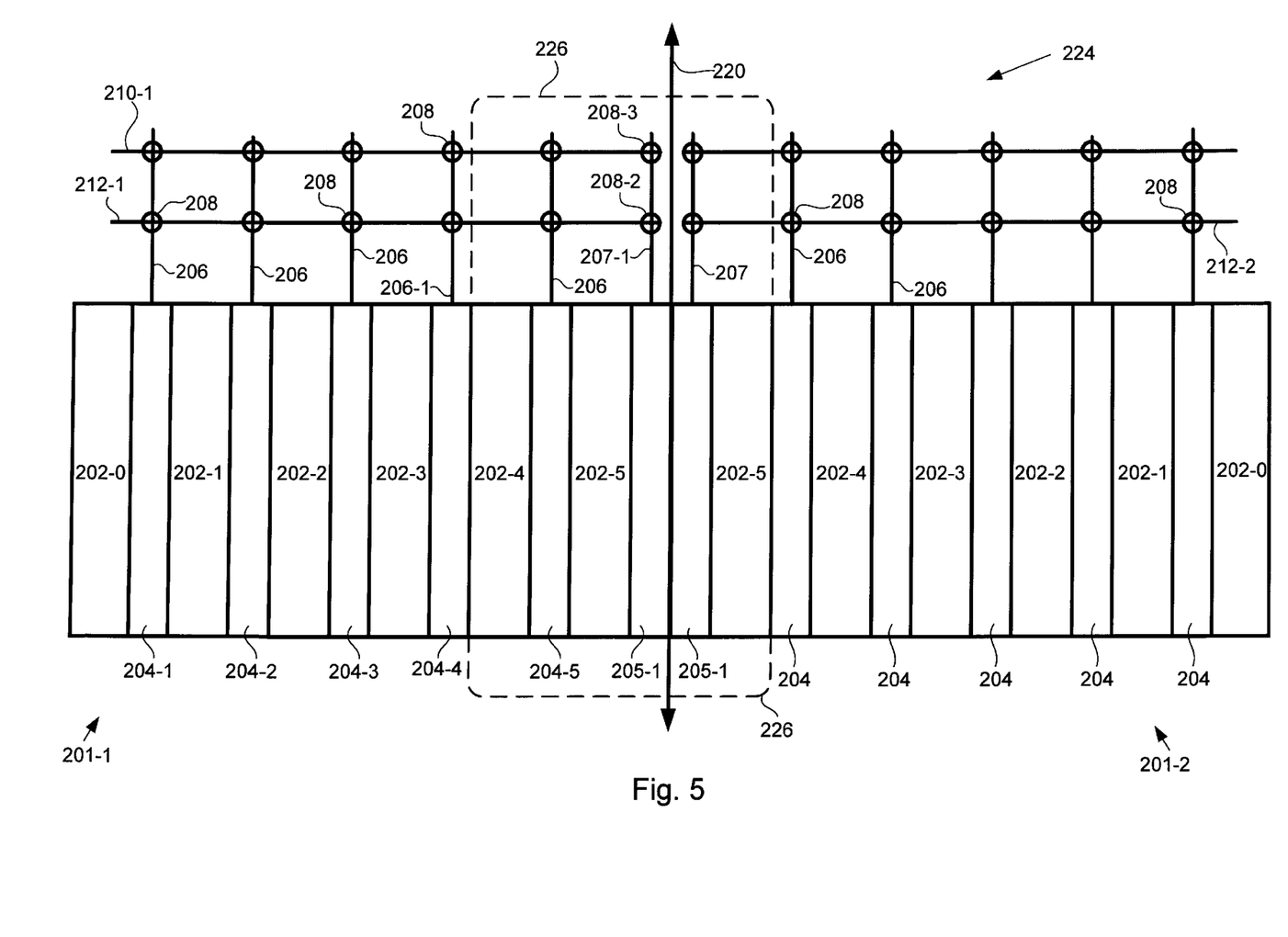
FIG. 5 illustrates a detailed view of a representative portion of the CPLD illustrated in FIG. 4B according to one embodiment of the invention.

FIG. 5 illustrates a detailed view of the representative portion 224 of the CPLD 200 illustrated in FIG. 4B according to an embodiment of the invention. A group of LABs (otherwise referred to as a "GOL") can be formed by programmably connecting selected ones the function blocks 202-0 through 202-5 included in the multi-function block 201-1 using associated ones of the programmable interfaces arrays 204-1 through 204-5. The group of LABs can, in turn, be connected to the bi-directional ports, for example, using the functional block 202-0 configured to operate as an I/O block 202-0. For example, the I/O block 202-0 can be coupled to the LAB 202-1 by way of the programmable interconnect array 204-1. In a similar fashion, LABs 202-2 and 202-3 as well as the EAB 202-4 and the TLAB 202-5 can be connected by way of the programmable interconnect arrays 204-1 through 204-5, respectively.

A tristate bus programmable interconnect array (TBPIA) 205 can be used to connect the TLAB 202-5 to the local horizontal conductor 212 and/or the global horizontal conductor 210 by way of a TBPIA I/O line 207 using selected programmable connectors 208. For example, the TLAB 202-5 can be connected to the local horizontal conductor 212-1 and/or the global horizontal conductor 210-1 by way of the TBPIA I/O line 207-1 using the programmable connectors 208-2 and 208-3, respectively. In the described embodiment, the TBPIA 205 is used to operatively connect the TLAB 202-5 to the tristate bus 220.

Any of the function units 202 can communicate with any other function units 202 included in the CPLD 200. The function units 202 can also communicate with any external circuitry appropriately connected to the CPLD 200. By way of example, the EAB 202-4 or the LAB 202-3 can send or receive signals, such as source data signals or tristate driver select signals, to or from the TLAB 202-5. For example, the EAB 202-4 can send or receive signals (such as source data signals or tristate driver select signals) to the TLAB 202-5 using the programmable interconnect array 204-5. Alternatively, the EAB 202-4 or the LAB 202-3 can send or receive signals to or from the TLAB 202-5 using, for example, the programmable interconnect array 204-4 and the PIA I/O line 206-1 associated therewith. The PIA I/O line 206-1 can be connected to the local horizontal conductor 212-1, which in turn can be connected to the TBPIA I/O line 207-1. The TBPIA I/O line 207-1 in turn operatively connects to the TBPIA 205-1 associated with the TLAB 202-5. This ability to connect any function units to any TLABs included within the CPLD 200 substantially increases the ability of any place and route software to fit a desired logic function as compared to conventional CPLD architectures.

It should be noted that in the described embodiment shown in FIG. 5, the local horizontal conductors 212-1 and 212-2 may communicate with each other by way of the global horizontal conductor 210-1, for example. In another embodiment, the local horizontal conductor 212 may in fact be a single conductor line extending the length of both the multi-function blocks 201-1 and 201-2. In yet another embodiment, the local horizontal conductor 212 can be formed of two separate conductor lines programmably connected by way of an associated programmable interconnect array.

Figure 6:
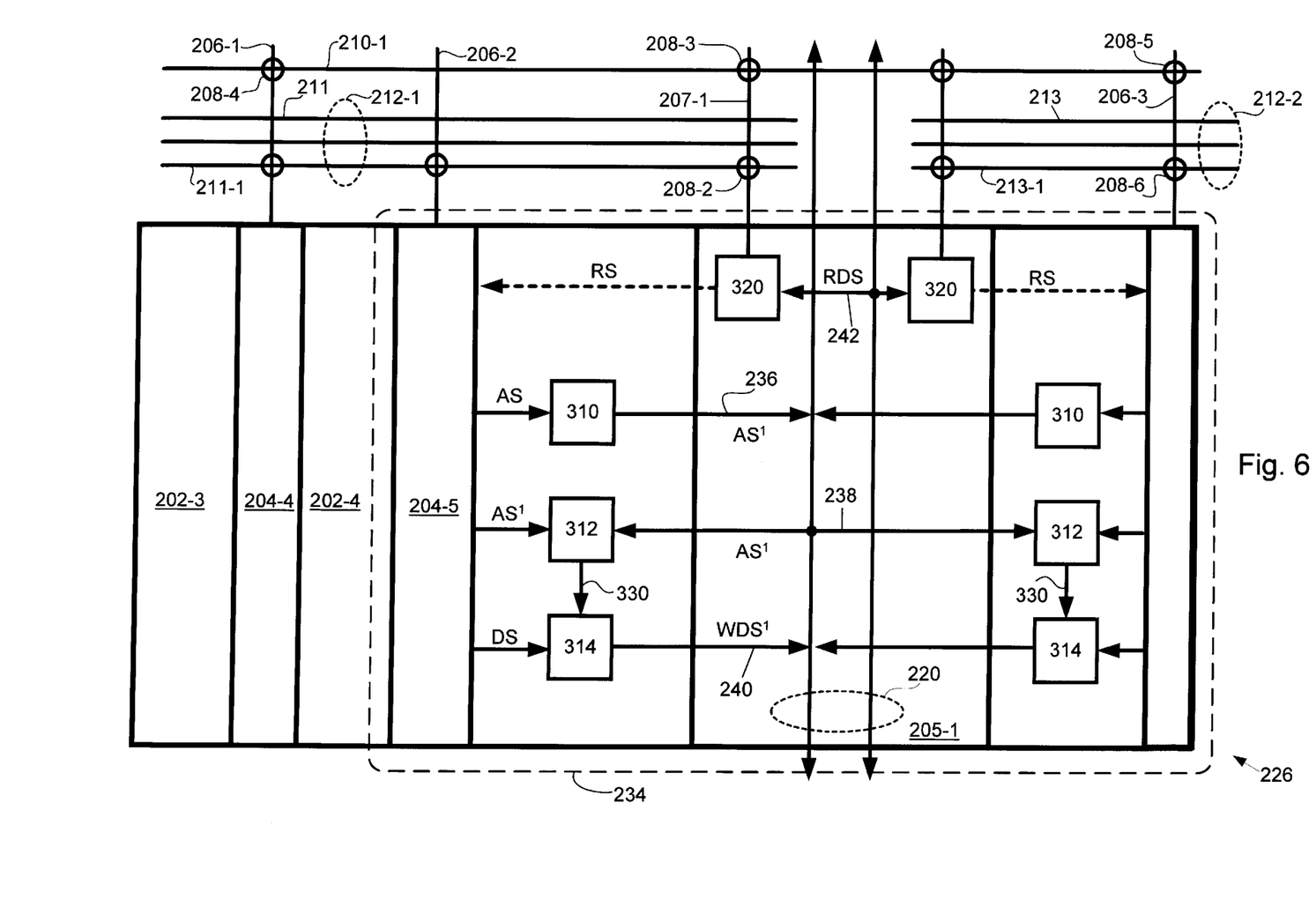
FIG. 6 illustrates a detailed view of a representative portion of the CPLD illustrated in FIG. 5 according to one embodiment of the invention.

FIG. 6 illustrates a detailed view of the representative portion 226 of the CPLD 200 illustrated in FIG. 5 according to an embodiment of the invention. The local horizontal conductors 212-1 and 212-2 are each formed of conductive lines 211 and 213, respectively. In one embodiment, each of the conductor lines 211 included in the local horizontal conductor 212 can be programmably connected to the PIA I/O lines 206 and the TBPIA I/O lines 207 by way of the programmable connectors 208. By way of example, the conductor line 211-1 included in the local horizontal conductor 212-1 can be connected to the PIA I/O line 206-1 associated with the programmable interconnect array 204-4 by way of the programmable connector 208-1. In a similar fashion, the conductor line 211-1 can be connected to the TBPIA I/O line 207-1 associated with the TBPIA 205-1 by way of programmable connector 208-2. In this manner, any place and route software can, for example, enable a communication link between the LAB 202-3 and the TLAB 202-5. Other communication links can be formed in a similar manner as deemed suitable in order to implement desired logic functions in the CPLD 200.

It should be noted that in the described embodiment, the local horizontal conductors 212-1 and 212-2 terminate on either side of the tristate bus 220 in such a manner that there is no common conductor line between them. It is for this reason that any conductor line 211 included in the local horizontal conductor 212-1 can only indirectly communicate with any conductor line 213 included in the local horizontal conductor 212-2. By way of example, the conductor line 211-1 can be connected to the global horizontal conductor 210-1 by way of the PIA I/O line 206-1 and programmable connectors 208-1 and 208-4. The global horizontal conductor 210-1 in turn can be connected to a PIA I/O line 206-3 by way of a programmable connector 208-5. The PIA I/O line 206-3 can then be connected to the conductor line 213-1 included in the local horizontal conductor 211-2 by way of a programmable connector 208-6. In this manner, the multi-function block 201-1 and any of the function units 202 included therein can be connected to the multi-function block 201-2 or any other multi-function blocks 201 included in the CPLD 200.

In one embodiment of the tristate bus 220, the tristate bus 220 includes a tristate driver cell address bus 228, hereinafter referred to as the tristate address bus 228 and a tristate data bus 230. The TLAB 202-5 includes an address signal generator unit 310 capable of receiving an address signal (AS) from a variety of sources including, for example, the EAB 202-4 by way of the programmable interconnect array 204-5. The address signal generator unit 310, in turn, can be connected by way of the TBPIA 205-1 to the tristate address bus 228 using, for example, connector line 236. The tristate address bus 228 can also be connected to a tristate address signal decoder unit 312 included in the TLAB 202-5 using a connector line 238. In another embodiment, a decoded address signal can be sent directly to the tristate address signal decoder unit 312 by way of, for example, PIA 204-5. In the described embodiment, the tristate address signal decoder unit 312 is connected to a group of tristate driver cells included in a tristate driver cell block 314 by way of a tristate driver address bus 330. The tristate driver address bus 330 is capable of carrying any desirable number of appropriate signals to the group of tristate driver cells included in a tristate driver cell block 314.

In the described embodiment, the tristate address signal decoder unit 312 provides a number of tristate driver output enable (OE) signals capable of enabling selected ones of tristate driver cells included in the tristate driver cell block 314. It should be noted that a single TLAB can be a source of multiple unique bus signals. (i.e., both bit $A_0$ and $B_0$ of the four bit two data-word selector as shown in FIG. 3.) The tristate driver cell block 314 has an output line 240 connected by way of the TBPIA 205-1 to the tristate data bus 230. A tristate data read unit 320 capable of receiving tristate logic signals in a READ operation, for example, is connected to the tristate data bus 230 by way of a connector line 242. The tristate data read unit 320 is connected to the TBPIA I/O line 207-1 as well as the PIA 204-5 thereby providing multiple read data paths.

In the described embodiment, the tristate driver cell block 314 has an input line capable of receiving data signals (DS) from a variety of sources including, for example, the EAB 202-4 by way of the programmable interconnect array 204-5. Such data signals (DS) can, for example, be produced by any function unit 202 and communicated to any of the tristate driver blocks 314 included in any TLAB within the CPLD 200.

In operation, any of the function units 202 included in the multi-function blocks 201 included in the CPLD 200, or any external circuitry connected to any I/O port of the CPLD 200, can pass data to the tristate data bus 230 in what is referred to as a WRITE operation. Alternatively, the tristate data bus 230 can pass data to any of the function blocks 202 included in any of the multi-function blocks 201 included in the CPLD 200 or to external circuitry connected to any I/O port of the CPLD 200 in what is referred to as a READ operation. By way of example, the LAB 202-3 can pass data to the TLAB 202-5 in the manner described above. Such data can include, for example, a decoded address signal which can be used by the tristate driver address signal decoder unit 312 included in the TLAB 202-5 to enable selected ones of the tristate driver cells included in the tristate driver cell block 314.

In an exemplary WRITE operation, the LAB 202-3 can generate a desired signal such as the address select signal AS described above. The address select signal AS is then passed to the address signal decoder unit 310. The address decoder unit 310 then passes the tristate address select signal $AS^1$ to the tristate address bus 228 via the connector line 236 included in the tristate bus programmable interconnect array 205-1. The tristate address select signal $AS^1$ can then be passed to the tristate driver address signal decoder unit 312 which operates to generate a tristate driver cell output enable select signal which is passed to the tristate driver cell block 314. A predetermined tristate driver cell (or tristate driver cells) uniquely associated with the tristate address select signal $AS^1$ included in the tristate driver cell block 314 is thereby enabled. The enabled tristate driver cell included in the driver cell block 314 then passes a write data signal $WDS^1$. The write data signal $WDS^1$ can be formed from the data signal DS received from the EAB 202-4, for example. In this way, the write data signal $WDS^1$ is WRITTEN to the tristate data bus 230. It should be noted that this capability of selectively enabling/disabling tristate driver cells using a common address signal 228 and similar address signal decoder units 310 limits the difference in path lengths of the output. This prevents the possibility of enable signal 330 to tristate driver cells driving the same tristate bus signal 230.

In an exemplary READ operation, the tristate data read unit 320 receives a read data signal $RDS^1$ from the tristate data bus 230 by way of the connector 242. The tristate data read unit 320 can, in turn, convert the received read data signal $RDS^1$ to a read signal RS having an appropriate format suitable for transmission to any function units 202 included in the CPLD 200.

It should be noted that in one embodiment, the tristate data bus 230 can include a group of tristate driver channels (not shown) each of which may be programmably connected to tristate driver cells as deemed suitable for a particular application. In this manner, the tristate data bus 230 can have more than one data signal DS written to it from more than a signal data signal source. One such additional data signal source can be an EAB 202-4 included in the multi-function block 201-2.

Figure 7:
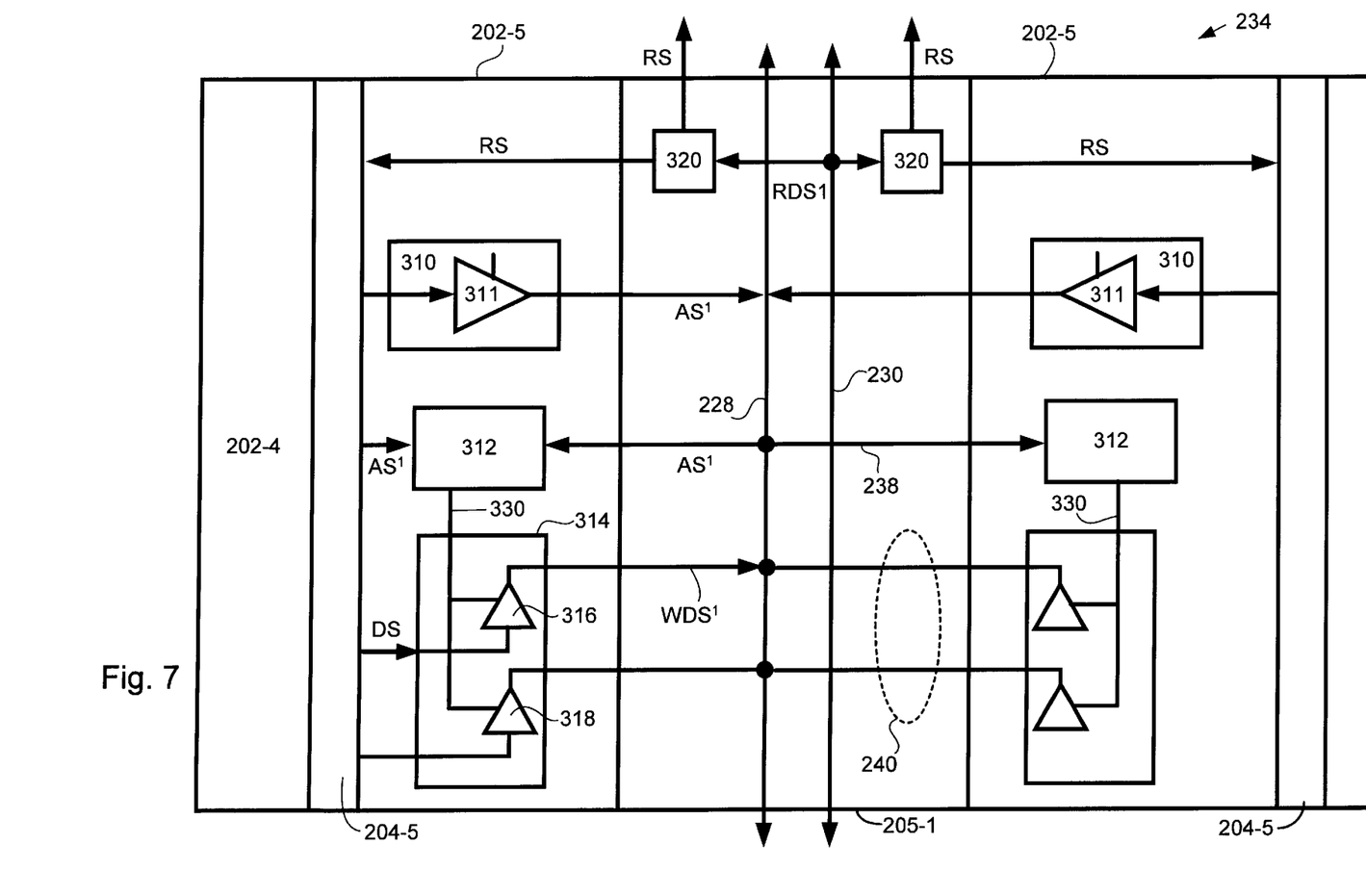
FIG. 7 illustrates a detailed view of a representative portion of the CPLD illustrated in FIG. 6 configured to operate as a single bit selector circuit according to one embodiment of the invention.

FIG. 7 illustrates a detailed view of a representative portion 234 of the CPLD 200 illustrated in FIG. 6 configured to operate as a single bit selector circuit according to one embodiment of the invention. As shown, in operation as a single bit selector circuit, the TLAB 202-5 can have the address signal decoder unit 310 include a tristate driver 311 or other such device which converts the received address signal AS to a tristate driver cell address signal $AS^1$. In the described embodiment, the tristate driver cell address signal $AS^1$ can be transmitted on the tristate address bus 228. The tristate driver cell address signal $AS^1$ contains information which causes the tristate driver address signal decoder unit 312 to send enabling signals by way of the signal bus 330 to a predetermined (by programming) tristate driver cell 316, for example, included in the tristate driver cell block 314. In another embodiment, the tristate driver cell address signal $AS^1$ can be generated by, for example, the EAB 202-4, and sent directly to the tristate driver address signal decoder unit 312 resulting in faster performance, although, contention prevention is now up to the user.

In an exemplary WRITE operation, a first data signal DS is supplied to an input of the tristate driver cell 316 from the EAB 202-4, for example. The tristate driver cell 316 converts the received data signal DS to a write data signal $WDS^1$. In another case, the first data signal DS can be supplied by any other of the function blocks 202 included in the CPLD 200 or even from external circuitry connected to any bi-directional I/O port, such as the bi-directional I/O port 216-1 included in the CPLD 200. It should be noted that since only the predetermined tristate driver cell 316 is enabled to supply the first data signal DS to the tristate data bus 230 there can be no contention with other of the tristate driver cells, such as for example a tristate driver cell 318, also connected to the tristate data bus 230. It should also be noted, that additional data signals and/or address select signals can be supplied from any of the function blocks 202 included in the CPLD 200. It should be noted that address bus is designed to avoid temporary contention caused by skew and guarantee by design successful operation.

In an exemplary READ operation, the tristate data read unit 320 receives a read data signal $RDS^1$ from the tristate data bus 230 by way of the connector 242. The tristate data read unit 320 can, in turn, convert the received read data signal $RDS^1$ to a read signal RS having an appropriate format suitable for transmission to any function units 202 included in the CPLD 200. The read signal RS can be output to either the TBPIA I/O line 207-1 as well as to the PIA 204-5.

Figure 8:
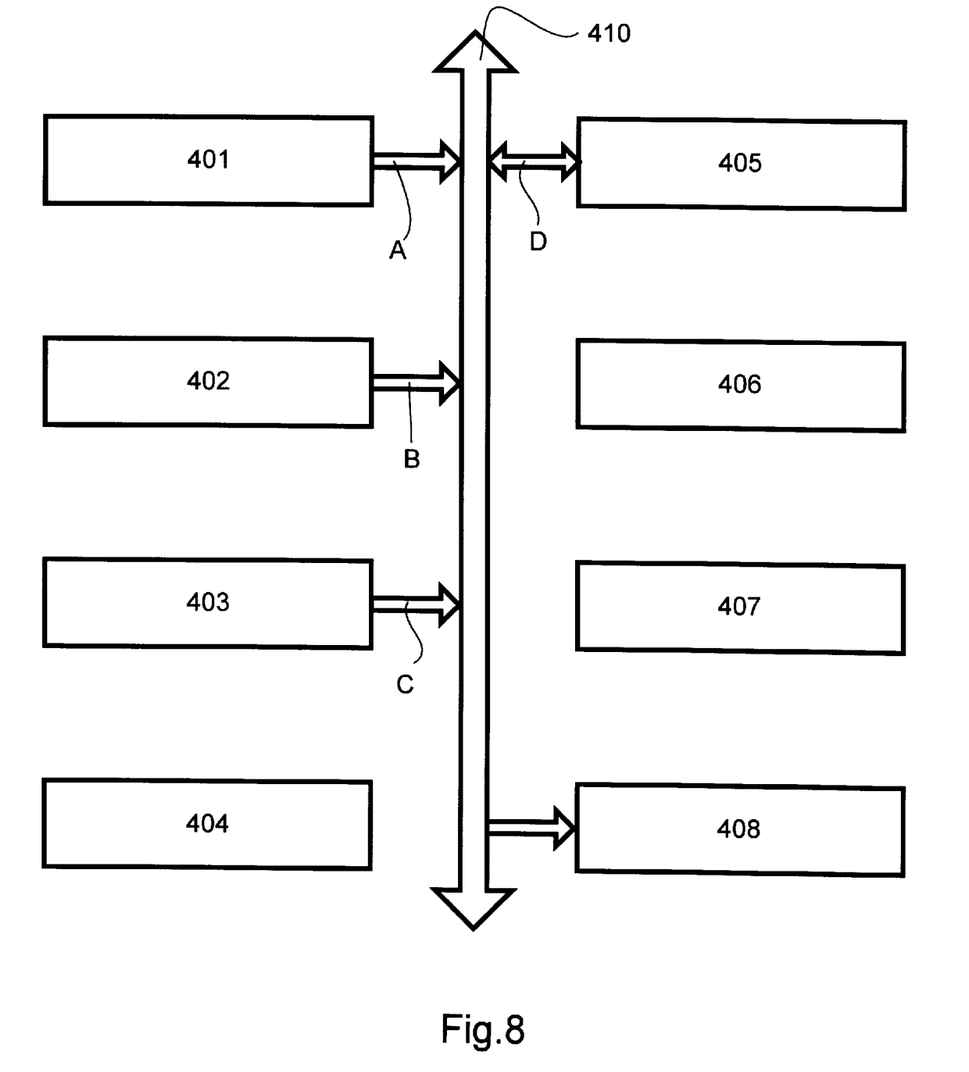
FIG. 8 illustrates a block diagram of a group of multi-function blocks arranged to operate as a four-data word selector circuit according to one embodiment of the invention.

FIG. 8 illustrates a block diagram of a group of multi-function blocks arranged to operate as a four-data word selector circuit according to one embodiment of the invention. As shown, the multi-function blocks 401, 402, 403, and 405 can act as data word sources. By way of example, the multi-function block 401 can supply a data word A, the multi-function block 402 can supply a data word B, the multi-function block 403 can supply a data word C, while the multi-function block 405 can supply a data word D to a tristate data bus 410 forming the inputs to the one-of-four word selector circuit, otherwise referred to as a four to one multiplexer. The purpose of the one-of-four-word selector circuit is to select one of the four input data words based upon one or more selected signals.

In operation, the place and route software has formed the one-of-four word selector circuit by suitably connecting the multi-function blocks 401–408 as shown in FIG. 8. It should be noted that the multi-function blocks can be located in any suitable location within the CPLD 200, or in some cases, may in fact be located in external circuitry and connected by way of any of the I/O ports. A multi-function block 405 can be used, for example, to both read the appropriate output result of the one-of-four word selector circuit and write an input data word to the one-of-four word selector circuit. In some instances, any of the source multi-function blocks 401–408 used as sources can also be used to READ the output result of the one-of-four word selector circuit.

Several advantages in fitting a logic function in a CPLD using the tristate logic array block (TLAB) and the tristate bus stem from ability to prevent tristate driver contention due to skew caused by differences in path length in output enable signals. Another advantage is that the risk of fitting a logic function with unacceptable performance problems caused by circuitous routing is substantially reduced. Another advantage relates to increased flexibility in routing signal paths since each of the function units can communicate with any other function unit in the CPLD as required in fitting a desired logic function. Consequently, this increase in flexibility enables the CPLD to fit more complex logic functions more often than is possible with conventional CPLD architectures.

Although the foregoing invention has been described in some detail for purposes of clarity of understanding, it will be apparent that certain changes and modifications may be practiced within the scope of the appended claims. It should be noted that there are many alternative ways of implementing the present invention. It is therefore intended that the following appended claims be interpreted as including all such alterations, permutations, and equivalents as fall within the spirit and scope of the present invention.

What is claimed is:

1. An integrated circuit, comprising:
    a plurality of interconnect lines;
    a plurality of multi-function blocks wherein each of said multi-function blocks includes a plurality of integrally connected function units, wherein at least one of the function units within said multi-function block is a tristate logic unit; and
    a tristate bus operatively connected to the tristate logic unit of said multi-function block, wherein said tristate logic unit can supply tristate logic signals to said tristate bus as well as receive tristate logic signals from said tristate bus, and wherein said tristate bus carries tristate data signals and address select signals, the address select signal operates to select a desired one of the tristate logic units within said integrated circuit.

2. An integrated circuit as recited in claim 1, wherein said tristate logic unit comprises:
    a plurality of drivers that are selectively enabled to couple data lines within said tristate logic unit to said tristate data bus; and
    an address comparison circuit that receives a designated address signal for a desired one of the tristate logic unit and compares at least a first portion the designated address signal with at least one predetermined address signal associated with said tristate logic unit to produce a select signal, the select signal being supplied to said drivers to selectively enable one or more of said drivers in accordance with a second portion of the designated address signal.

3. An integrated circuit as recited in claim 2, wherein said integrated circuit is a programmable logic device.

4. An integrated circuit as recited in claim 3, wherein at least one of said functional units is a logic array block, said logic array block includes a plurality of logic cells capable of forming simple logic functions.

5. An integrated circuit as recited in claim 3, wherein at least one of said functional units is an embedded array block, said embedded array block includes a plurality of memory cells, each of said memory cells being capable of performing desired memory functions.

6. An integrated circuit as recited in claim 3, wherein said memory cell is a static random access memory cell.

7. An integrated circuit comprising:
    a plurality of interconnect lines;
    a multi-function block having a plurality of integrally connected function units, at least one of the function units within said multi-function block is a tristate logic unit, wherein said multi-function block further includes a plurality of programmable interconnect arrays that are integrally connected with the function units and programmably connected to said interconnect lines; and a tristate bus operatively connected to the tristate logic unit of said multi-function block, wherein said tristate logic unit can supply tristate logic signals to said tristate bus as well as receive tristate logic signals from said tristate bus.

8. A programmable logic device comprising:

a plurality of interconnection lines;

a plurality of programmable logic blocks each of which performs desired logic functions;

a tristate bus;

a tristate driver block connected to the tristate bus, said tristate driver block includes,
 a plurality of tristate driver cells, each of which has a tristate driver cell input line, a tristate driver cell output line, and a tristate driver cell output enable line; and
 a tristate driver cell address decoder unit connected to the tristate driver cell output enable line;

a programmable memory block that includes a plurality of memory cells capable of performing desired memory functions;

an input/output (I/O) block capable of communicating to external circuitry; and a programmable interconnect array device configured to programmably interconnect said interconnect lines to any one or more of said plurality of programmable logic blocks, said tristate driver block, said programmable memory block, and said I/O block.

9. A programmable logic device as recited in claim 8 wherein said tristate driver cell address decoder unit receives a tristate driver cell address signal, said tristate driver cell address signal includes a first portion that is used by said tristate driver cell address decoder unit to enable selected one or more of the tristate driver cells such that said selected one or more of the tristate driver cells pass a desired signal to the tristate data bus.

10. A programmable logic device as recited in claim 9, wherein said programmable logic device is configured to include a programmable tristate logic-memory block, said programmable tristate logic-memory block is formed by connecting said input/output (I/O) block to said programmable logic block by way of a first programmable interconnect device, said programmable memory array block is connected to said programmable logic block by way of a second programmable interconnect device and to said tristate driver cell block by way of a third programmable interconnect device.

11. A programmable logic device as recited in claim 10, wherein the programmable tristate logic-memory blocks are arranged in horizontal rows and vertical columns.

12. The programmable logic device as recited in claim 11, wherein the tristate bus comprises:

a tristate driver cell address bus connected to said tristate driver cells, said tristate driver cell address bus carries the tristate driver address signal, and a tristate driver data bus, said tristate driver data bus carries the desired data signal.

13. A programmable logic device as recited in claim 10, wherein said programmable interconnect array device is interspersed between the functional units and further includes a programmable interconnect array I/O line having an associated plurality of programmable connectors, said programmable connectors capable of connecting selected ones of the plurality of interconnection lines to selected ones of the functional units.

14. A programmable logic device as recited in claim 9, wherein the interconnection lines further include:

a global horizontal conductor having associated programmable connectors, the global horizontal conductor being capable of programmably connecting to all programmable tristate logic-memory blocks included in a horizontal row;

a local horizontal conductor having associated programmable connectors, the local horizontal conductor being capable of programmably connecting to a portion of said programmable tristate logic-memory blocks included in said horizontal row; and a global vertical conductor having associated programmable connectors, the global vertical conductor being capable of programmably connecting to said programmable tristate logic-memory blocks included in a vertical column.

15. The programmable logic device as recited in claim 14, wherein said tristate driver cell block further includes a tristate driver cell address decoder unit connected to said tristate driver cell address line, said tristate driver cell address decoder unit decodes received said tristate driver cell address from said tristate address cell address line and selectively enables said tristate driver cell uniquely associated with said tristate driver cell address by way of said tristate driver output enable line.

16. The programmable logic device as recited in claim 15, wherein said tristate driver cell output line is connected to said tristate data bus.

17. The programmable logic device as recited in claim 16, wherein said memory cell is a static random access memory cell.

18. A method of configuring a programmable logic device to implement desired logic functions, said programmable logic device includes a plurality of interconnection lines, a plurality of bi-directional I/O ports, and a multi-function block having a plurality of integrally connected function units at least one of which is a tristate logic unit operatively connected to a tristate bus, wherein said tristate logic unit can supply tristate logic signals to said tristate bus as well as receive tristate logic signals from said tristate bus, comprising:

connecting at least one of the plurality of bi-directional I/O ports to an external circuit, the external circuit being capable of generating program signals capable of causing selected ones of the plurality of functional units included in the multi-function blocks to be programmed to perform at least a subpart of the desired logic function to be fitted;

programming the selected ones of the plurality of functional units included in the multi-function blocks using the program signals so as to perform the associated subpart of the logic function to be fitted;

determining a first desired coupling path in the core region such that each of the selected ones of the plurality of functional units included in the multi-function block that have been programmed are coupled to said tristate logic unit in such a way as to enable the integrated circuit to perform at least the subpart of the desired logic function; and determining a second desired coupling path from said tristate logic unit in the core region to said bi-directional I/O ports located in said peripheral region, the second desired coupling path interconnects with the first desired coupling path using the tristate data bus so as to route data signals between the bi-directional ports and the core region.

19. A method of using a programmable logic device having tristate logic units, each of said tristate logic units include a plurality of drivers, data lines, and an address comparison circuit, said programmable logic device also includes a tristate bus operatively connected to said tristate logic units, said tristate bus carries tristate data signals and address select signals that operate to select a desired one of said tristate logic units within said programmable logic device, comprising:

receiving a designated address signal for a desired one of said tristate logic units;

comparing at least a first portion said designated address signal with a predetermined address signal associated with said tristate logic unit; and selectively enabling one or more of said drivers in accordance with a second portion of said designated address signal to couple data lines within said tristate logic unit to said tristate data bus when said comparing indicates said first portion of said designated address signal matches said predetermined address signal.

* * * * *